United States Patent
Nakura et al.

[11] Patent Number: 6,127,720
[45] Date of Patent: Oct. 3, 2000

[54] SEMICONDUCTOR DEVICE AND METHOD FOR MANUFACTURING THE SAME

[75] Inventors: Hideaki Nakura, Osaka; Isamu Kawashima, Shiga; Jutarou Kotani, Kyoto; Hidekazu Nakamura, Osaka, all of Japan

[73] Assignee: Matsushita Electronics Corporation, Osaka, Japan

[21] Appl. No.: 09/075,804

[22] Filed: May 11, 1998

[30] Foreign Application Priority Data

| May 19, 1997 | [JP] | Japan | ................................. 9-129045 |
| May 19, 1997 | [JP] | Japan | ................................. 9-129046 |

[51] Int. Cl.$^7$ .................................................. H01L 21/306
[52] U.S. Cl. .......................... 257/509; 257/515; 257/586
[58] Field of Search .................................. 257/501, 506, 257/510, 511, 515, 586, 626, 559

[56] References Cited

U.S. PATENT DOCUMENTS

| 3,886,005 | 5/1975 | Cota et al. ................................. 257/506 |
| 4,249,195 | 2/1981 | Roger ....................................... 257/506 |
| 4,445,967 | 5/1984 | Kameyama et al. ..................... 156/648 |
| 4,561,172 | 12/1985 | Slawinski et al. ........................ 29/576 |
| 4,982,269 | 1/1991 | Calligaro ................................. 257/506 |
| 5,149,663 | 9/1992 | Chai et al. ................................. 437/31 |
| 5,436,495 | 7/1995 | Sakamoto ................................. 257/506 |
| 5,493,149 | 2/1996 | Jerome et al. ........................... 257/557 |

FOREIGN PATENT DOCUMENTS

| 2851186 | 6/1979 | Germany ................................ 257/586 |
| 60-241261 | 11/1985 | Japan . |
| 63-232461 | 9/1988 | Japan . |
| 63-305556 | 12/1988 | Japan ..................................... 257/506 |
| 1-160052 | 6/1989 | Japan ..................................... 257/510 |
| 6-124940 | 5/1994 | Japan . |
| 6-204232 | 7/1994 | Japan . |
| 7-99243 | 4/1995 | Japan . |

*Primary Examiner*—Donald L. Monin, Jr.
*Attorney, Agent, or Firm*—Merchant & Gould P.C.

[57] ABSTRACT

A semiconductor device provided with a wide and shallow first groove and a second groove in the first groove area, having a narrower width than that of the first groove around a predetermined area in a one-conductive area provided in the upper region of a semiconductor substrate as a mesa groove, wherein at least the second groove is covered with an electrical insulator. The upper surface of the electrical insulator is located approximately as high as or lower than the upper surface of the electrical insulating film. Thus, especially in a mesa semiconductor device with a high-voltage resistance, an insulating protective layer having a sufficient thickness can be formed stably over the entire region of a mesa groove. As a result, the variation in high-voltage resistance characteristics can be decreased and the processing yield affected by breakage or cracking in the mesa groove region during subsequent processes caused by the formation of the mesa groove can be improved greatly.

3 Claims, 15 Drawing Sheets

SEMICONDUCTOR DEVICE AND METHOD FOR MANUFACTURING THE SAME

FIELD OF THE INVENTION

The present invention relates to a semiconductor device with a high-voltage resistance in which electrical insulation is provided by a groove (particularly, a mesa groove) and its electrical insulator (an electrical insulating protective layer), for example, a bipolar transistor, a metal-oxide semiconductor (MOS), an insulated gate bipolar transistor (IGBT), a diode, a thyristor, a triac, or the like. Especially, the present invention relates to a vertical semiconductor device with a high-voltage resistance in which variations in manufacturing stability and in voltage-resistive characteristics are decreased and to a method for manufacturing the same.

BACKGROUND OF THE INVENTION

Conventionally, a semiconductor device with a high-voltage resistance has been improved variously in order to realize a high-voltage resistance and a low price, and structures shown in FIGS. 14 and 15 have been employed.

FIG. 14 shows a schematic cross-sectional view illustrating an example of the structure of a mesa bipolar transistor. FIG. 14 comprises a silicon substrate (an N-type area) 1, a collector diffusion area 2, a base diffusion area 3, an emitter diffusion area 4, a silicon dioxide film (an electrical insulating film) 5, a mesa groove 7, an insulating protective layer 9 of the mesa region, a base electrode 10, an emitter electrode 11 and a collector electrode 12.

FIG. 15 shows a schematic cross-sectional view illustrating an example of the structure of a planar-type bipolar transistor. In FIG. 15, a numeral 13 indicates a field plate and the explanation for the same numbers as in FIG. 14 indicating the same parts is omitted.

In a mesa bipolar transistor with a high-voltage resistance shown in FIG. 14, the insulating protective layer 9 (a glass protective layer) made of a lead-based or zinc-based glass film is formed in the mesa groove 7 in which silicon is etched selectively on the surface side of the semiconductor silicon substrate 1 in order to obtain a high-voltage resistance and high-reliability. The depth of the mesa groove 7 is formed so as to be deeper than a thickness (the thickness is indicated by T) of a high-resistive area in the semiconductor substrate in order to obtain the reliability and then the insulating protective layer 9 is formed.

Since an electric field concentration occurs at the boundary region between the silicon substrate (the semiconductor substrate) 1 and the base diffusion area (one-conductive area) 3, it is desirable that the thickness of the insulating protective layer 9, especially in this region (the thickness of the insulating protective layer 9 in the vertical direction with respect to the internal circumference surface of the mesa groove 7 at the boundary region), is 10 μm or more. In the case where the thickness at the boundary region is less than 10 μm, its effect as an insulating protective layer in subsequent manufacturing processes is small. Therefore, a manufacturing yield decreases and high-reliability cannot be ensured.

As a method of forming the insulating protective layer (the glass protective layer) 9, an electrodeposition technique is known. A glass protective layer having a uniform thickness is easily formed at a conductive region by the electrodeposition technique. However, in the case of using the electrodeposition technique, the glass protective layer is formed at all conductive regions. Therefore, it is necessary that a contact window for forming an electrode provided in the silicon dioxide film (an electrical insulating film) 5, be formed after forming the glass protective layer. On the contrary, there has been a problem in protecting insulation, since a glass protective layer is not formed on the silicon dioxide film (an electrical insulating film) 5 around the upper region of the mesa groove 7 in principle.

Then, as a means of solving the problems of the electrodeposition technique mentioned above, it is common to form the insulating protective layer (the glass protective layer) 9 by an application method. In the case of using the application method, it is possible to form a glass protective layer regardless of the conductivity of the substrate.

However, the thickness of the glass protective layer in the periphery of an opening region of a mesa groove tends to become thin by adhesiveness, or the like, of an applied glass protective layer at the time of the application. Particularly, as mentioned above, the mesa groove 7 is formed as a deep groove having a deeper depth than the thickness (T) of the high-resistive area in the semiconductor substrate in order to obtain high reliability. Therefore, the tendency is prominent and it has been difficult to form an insulating protective layer (a glass protective layer) having a thickness of 10 μm or more on the entire region of the mesa groove. As a result, variation in high voltage-resistance characteristics has occurred.

The thickness of the semiconductor substrate in the region where the mesa groove is formed decreases considerably by forming the mesa groove so as to be deeper than the thickness (T) of a high-resistive area. As a result, the mechanical strength of the semiconductor substrate decreases. Damages, such as breakage, cracking, or the like, occur in the region where the mesa groove is formed in the semiconductor substrate by mechanical contact in subsequent processes, thus decreasing the processing yield during the manufacturing process considerably.

On the other hand, in a planar-type bipolar transistor as shown in FIG. 15 it is common to realize a high-voltage resistance by using a FLR (field limiting ring) structure. However, the more resistive to a high voltage the planar-type bipolar transistor is, the larger the proportion that a field plate 13 occupies in the semiconductor substrate region must be when utilizing this technique. Thus, a problem exists in the art particularly because a utilization factor of the semiconductor substrate is greatly reduced.

SUMMARY OF THE INVENTION

The objects of the present invention are to solve the problems in the prior art mentioned above and to provide a semiconductor device in which an insulating protective layer having a sufficient thickness can be formed stably over the entire region of a mesa groove, especially in a mesa semiconductor device with a high-voltage resistance; as a result, the variation in high-voltage resistance characteristics can be decreased; the processing yield affected by breakage or cracking in the mesa groove region during subsequent manufacturing processes, caused by the formation of the mesa groove, can be greatly improved; and a method for manufacturing such a semiconductor device.

In order to attain the objects mentioned above, a semiconductor device according to the present invention has the following structure.

A semiconductor device according to a first structure of the present invention is characterized by comprising a one-conductive area with a thickness D3, as shown in FIG. 1, provided in the upper region of a semiconductor substrate, a wide and shallow first groove (width: W1, depth: D1) provided around a predetermined area in the one-conductive area, a second groove (width: W2, depth: D2) having a narrower width than that of the first groove provided in the first groove area and an electrical insulator covering at least the second groove.

According to the first structure, a mesa groove is formed by the wide and shallow first groove and the second groove, having a narrower width than that of the first groove is formed within the first groove area, and at least the second groove is selectively covered with an electrical insulator. Therefore, an insulating protective layer having a sufficient thickness over the entire mesa groove can be formed stably. As a result, a semiconductor device having little variation in high-voltage resistance characteristics can be obtained. Since a thick electrical insulating layer can be formed, the depth of the mesa groove required for obtaining sufficient insulation reliability can be made shallow. Therefore, the thickness of the semiconductor substrate in the region where the mesa groove is formed can be ensured sufficiently, decrease in mechanical strength can be prevented and the processing yield affected by breakage or cracking in the mesa groove region during subsequent manufacturing processes can be improved greatly.

In addition, according to the first structure mentioned above, the following collateral effects can also be obtained: in a process after forming the electrical insulator in the mesa groove, especially in a process of forming a contact window (hereafter also referred to as "a process of opening a contact window") for forming an electrode, the contact window and the electrode pattern can be made very small easily; and mechanical contact during mask alignment in a process of opening the contact window is diminished.

These collateral effects will be explained as follows.

In a conventional mesa bipolar transistor, as shown in FIG. 14, it cannot be avoided that an insulating protective layer 9 is also formed on an electrical insulating film 5, or the like, on the surface side of a semiconductor substrate when forming a uniform insulating protective layer 9 having a necessary and sufficient thickness over the entire narrow and deep mesa groove 7 by an application method. In some cases, a convex region consisting of the insulating protective layer 9 is formed on the upper surface of the electrical insulating film 5 on the semiconductor substrate that is higher by 5 $\mu$m or more. Such a convex region hinders making a contact window and an electrode pattern formed within the contact window from being made very small in subsequent processes, after forming the insulating protective layer 9. Especially in a process of forming the contact window for forming an electrode in the electrical insulating film 5. Therefore, the convex region has been an obstacle in an element design. In the process of opening the contact window, mechanical contact with the convex region occurs during mask alignment that is required for opening the window selectively. During this process breakage and cracking in the mesa groove region occurs, thus decreasing the processing yield during the manufacturing processes greatly.

On the contrary, in a semiconductor device having the first structure mentioned above according to the present invention, even if a necessary and sufficient electrical insulator is formed, its upper surface can be easily restrained so as to be lower than the upper surface of an electrical insulating film. Even if the electrical insulator adheres on the upper surface of the electrical insulating film, the convex region formed by the adhesion is extremely low compared to that in the prior art. That is to say, it becomes possible to form the upper surface of the electrical insulator in the first groove so as to be approximately as high as or lower than the upper surface of the electrical insulating film on the one-conductive area.

By forming the upper surface of the electrical insulator in the first groove so as to be approximately as high as or lower than the upper surface of the electrical insulating film on the one-conductive area, a later process, i.e. a process of opening the window for forming an electrode after forming the electrical insulator, can be proceeded by the same processes as those in manufacturing a conventional planar type semiconductor, since the flatness of the surface of the semiconductor substrate can be maintained. As a result, the size of an opening region, of the opened contact window region, can be designed (conventionally, in a mesa transistor with a high-voltage resistance, there has been a limit in making the size very small due to a convex region of a mesa groove) corresponding to the characteristics required for an element. Furthermore, in the processes occurring after forming the electrical insulator, the mechanical contact of the convex region on the surface of the semiconductor substrate and the mask for opening the window selectively is reduced. Additionally, the mesa groove can be made shallow, thus reducing breakage, cracking, or the like, of the semiconductor substrate during subsequent manufacturing processes. As a result, the processing yield can be greatly improved.

A semiconductor device according to a second structure of the present invention is characterized by comprising: a one-conductive area with a thickness D3 provided in the upper region of a reverse conductive type semiconductor substrate area with a thickness d2; a groove having a wider width W0 than d2 and a depth D0 deeper than D3 and shallower than d2 provided around a predetermined area in the one-conductive area so as to be in contact with the one-conductive area; an electrical insulating film surrounding the periphery of the upper region of the groove; a glass protective layer covering at least a portion of the upper surface of the electrical insulating film and the internal circumference of the surface of the groove; and an opening region formed on the one-conductive area.

According to the second structure, by forming a wide and shallow mesa groove provided on the surface side of the semiconductor substrate, the glass protective layer having a stable thickness formed in subsequent processes can be formed over the entire surface of the mesa groove. Particularly, it becomes easy to form the glass protective layer so as to have a thickness of 10 $\mu$m or more at the boundary region making contact with the one-conductive area formed in the semiconductor substrate with the high resistive area in the semiconductor substrate. As a result, especially in a structure of a mesa semiconductor device with a high-voltage resistance, variation in high-voltage resistance characteristics is diminished. Particularly, it is effective in the case of forming the insulating protective layer by a glass application. Since the structure has a wide and shallow groove, reduction in a thickness of the semiconductor substrate at the mesa groove region is diminished, thus preventing the decrease mechanical strength of the semiconductor substrate. As a result, the processing yield affected by breakage or cracking at the mesa groove region during subsequent manufacturing processes can be greatly improved. In the second structure, by making the width W0 of the groove wider and the depth shallower than the thickness T of the high resistance area, the voltage-resistive characteristics according to the present invention are obtained. In addition, since the insulating protective layer (a glass protective layer) can be formed accurately in the groove region, the variation in the voltage-resistive characteristics is diminished and therefore cracking at the groove region is prevented. Conventionally, it has been practical to form a deeper groove than the thickness T. However, on the contrary, according to the present invention making the groove shallower than the thickness T in the structure is being utilized positively.

A method of manufacturing a semiconductor device according to the present invention is characterized by comprising steps for providing: a one-conductive area in the upper region of a semiconductor substrate; a wide and shallow first groove (width: W1, depth: D1) around a predetermined area in the one-conductive area; a second groove (width: W2, depth: D2) having a narrower width than that of the first groove in the first groove area; and an electrical insulator at least in the second groove.

By employing such a structure, the semiconductor device according to the first structure of the present invention mentioned above can be manufactured effectively and efficiently.

In each structure of the present invention mentioned above, the term, "a predetermined area", in the one-conductive area means an area substantially forming a functional area of a semiconductor device (an actuating region of a transistor) in the one-conductive area formed in the upper region of a semiconductor substrate. It is necessary to provide the groove of the present invention so as to surround such "a predetermined area" in the one-conductive area, thus ensuring the insulation voltage resistance in the area.

DETAILED DESCRIPTION OF THE PRESENT INVENTION

Figure 1:
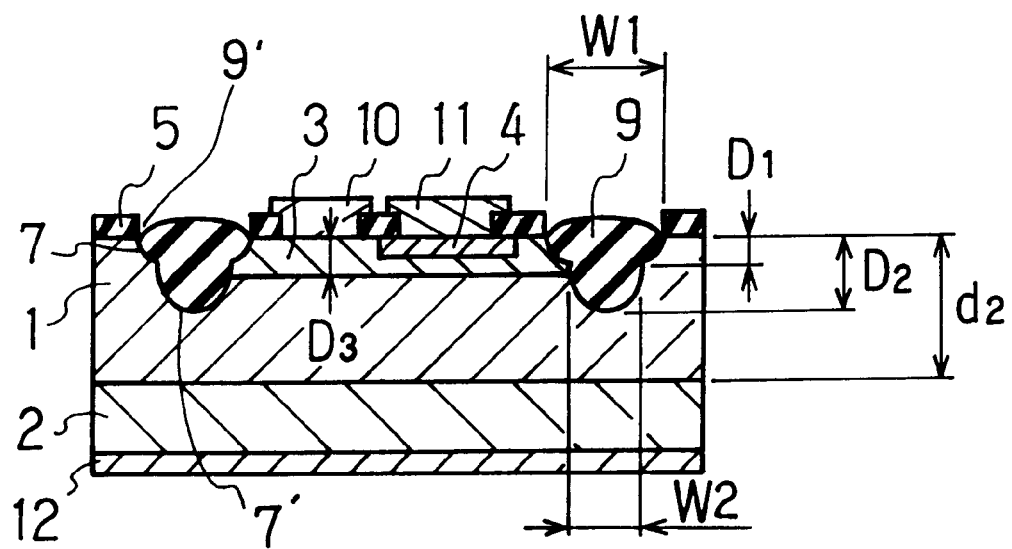
FIG. 1 shows a cross-sectional view of a mesa NPN transistor according to Example 1 of the present invention.

A semiconductor device according to a first structure of the present invention comprises: a one-conductive area with a thickness D3 provided in the upper region of a semiconductor substrate; a wide and shallow first groove (width: W1, depth: D1) provided around a predetermined area in the one-conductive area; a second groove (width: W2, depth: D2) having a narrower width than that of the first groove provided in the first groove area; and an electrical insulator covering at least the second groove.

In the structure mentioned above, it is preferable that an electrical insulating film is formed on the one-conductive area and that the upper surface of the electrical insulator is located approximately as high as or lower than the upper surface of the electrical insulating film. This means that the occurrence of a higher convex region formed of the electrical insulator than the upper surface of the electrical insulating film is restrained by making the upper surface of the electrical insulator covering the mesa groove approximately as high as or lower than the upper surface of the electrical insulating film formed on the one-conductive area.

In the structure mentioned above, it is preferable that the upper area of the electrical insulator is within the first groove area. This means that the electrical insulator covering the mesa groove does not protrude from the mesa groove. That is, the adhesion of the electrical insulator to the upper surface of the periphery of the first groove is prevented.

In the structure mentioned above, it is preferable that a recessed region formed by the surface of the electrical insulator and the internal circumference surface of the first groove is formed on the internal circumference region of the first groove. This means that it is preferable that the upper surface of the electrical insulator covering the mesa groove makes contact with the internal circumference surface of the first groove and thus forming the recessed region (a groove) at the point of contact.

In the structure mentioned above, it is preferable that a reverse conductive area is formed within the one-conductive area. The upper surface of the electrical insulator is located approximately as high as or lower than the highest region on the reverse conductive area, thus forming a contact window that makes contact with the reverse conductive area. In the case where an electrical insulating film, or the like, is formed on the reverse conductive area, the highest region on the reverse conductive area means the upper surface of the electrical insulating film. In the case mentioned above, the contact window corresponds to, for example, an opening region for forming an electrode in the reverse conductive area formed in the electrical insulating film.

According to each preferable structure mentioned above, especially in the manufacture of a mesa semiconductor element with a high-voltage resistance, the formation of a projection, or the like, formed of the electrical insulator (for example, a glass protective layer) on the upper surface of the semiconductor device can be restrained by making the electrical insulator covering the mesa groove formed on the surface side of the semiconductor substrate approximately as high as or lower than the upper surface of the electrical insulating film formed on the surface side of the semiconductor substrate. Therefore, the contact window and the electrode pattern can be made very small easily subsequent to the processes of forming the electrical insulator, particularly, in the process of opening the contact window for forming an electrode. In addition, since the mechanical contact is diminished during mask alignment in the process of opening the contact window, the yield in subsequent processes of forming the insulating film can be improved greatly. That is, according to each preferable structure, the effects mentioned above in the semiconductor device according to the first structure of the present invention is further manifested.

Figure 14:
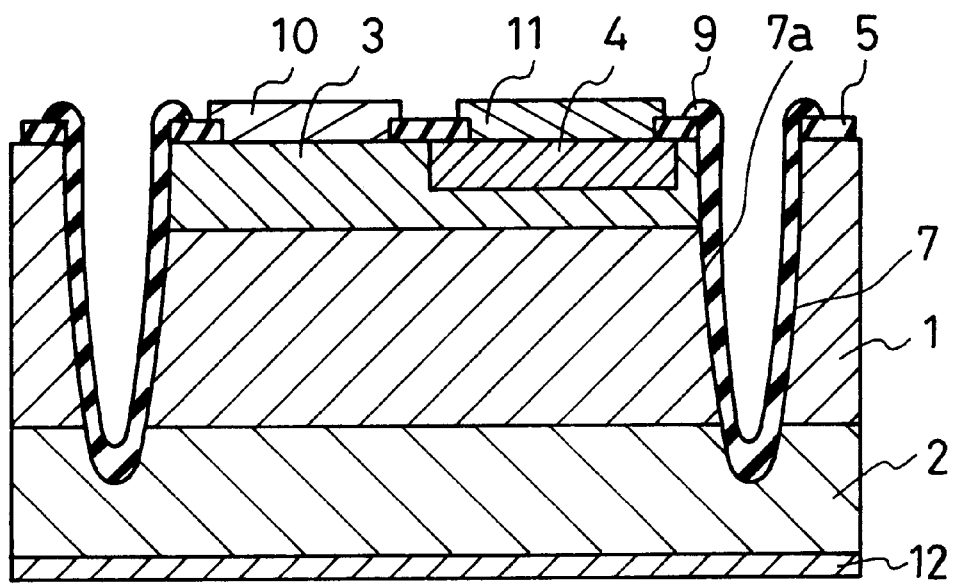
FIG. 14 shows a cross-sectional view illustrating a schematic structure of an example of a mesa transistor semiconductor element with a high-voltage resistance according to the conventional method.

Furthermore, in the structure mentioned above, it is preferable that the depth D1 of the first groove be shallower than the thickness D3 of the one-conductive area. As the prior art shows in FIG. 14, in the case where a mesa groove has one groove, it is necessary to form a deeper groove than the D3 in order to separate a base area and a collector area. However, since the inclination of the inner wall is steep in such a deep mesa groove, shifts occur during patterning. Especially, in the case where after applying the electrical insulator (a glass protective layer), the film onto which the electrical insulator is applied is patterned by exposure and development and then is calcinated. Consequently, in some cases, the electrical insulating layer having a desired thickness cannot be formed within the groove. Therefore, in order to form an electrical insulating layer having a sufficient thickness on the inner wall of the mesa groove, even in the case where shifts occur during patterning, it is necessary to pattern so that a predetermined volume of the electrical insulator remains in the peripheral area of the mesa groove. As a result, the electrical insulating layer (a glass protective layer) 9 that also covers the electrical insulating film 5 as shown in FIG. 14 is formed, thus producing the problem mentioned above.

In the present invention, the mesa groove has a double structure comprising the first groove and the second groove and at least the second groove is covered with the electrical insulator. Therefore, it is not necessary to worry about the shift mentioned above in patterning the electrical insulator in the second groove. Consequently, when making the depth D1 of the first groove shallower than the thickness D3 of the one-conductive area, the narrow second groove region performs mainly a function of separating the base area and the collector area, thus obtaining excellent voltage-resistive characteristics stably. Concurrently, since the inclination of the inner wall of the first groove is gentle due to the wide and shallow shape of the first groove, it is difficult to obtain a shift in patterning. Consequently, it is not necessary to leave the electrical insulator on the periphery of the upper region of the mesa groove as in the conventional method, thus restraining the formation of a projection, or the like, consisting of the electrical insulator covering the mesa groove on the upper surface of a semiconductor device.

In the structure mentioned above, it is preferable that the electrical insulating film having a predetermined opening region is formed on the one-conductive area. The use of the opening region as a contact window for forming an electrode makes it possible for the device to function as a semiconductor.

In the structure mentioned above, it is preferable that the thickness of the electrical insulator is 10 $\mu$m or more. Herewith, the thickness of the electrical insulator means the thickness of the electrical insulator in the vertical direction with respect to the internal circumference surface of the mesa groove. In the case where the thickness is less than 10 $\mu$m, the effect as an insulating protective layer during subsequent manufacturing processes is little. Therefore, the manufacturing yield decreases and it is difficult to ensure a high reliability. Particularly, it is preferable that the depth D2 of the second groove be deeper than the thickness D3 of the one-conductive area and the thickness of the electrical insulator at the boundary region between the semiconductor substrate and the one-conductive area is 10 $\mu$m or more. Since an electric field concentration occurs at the boundary region between the semiconductor substrate and the one-conductive area, the thickness of the electrical insulator in this region is important.

In the structure mentioned above, it is preferable that the second groove be formed obliquely. Here, the term "obliquely" means that the groove is formed obliquely in such a direction as the bottom region of the second groove enters into the lower region of the actuating region of a transistor. Especially, it is preferable that the inner groove wall of the second groove is formed obliquely in the inward direction. Here, the inner groove wall is a groove wall near the actuating region of a transistor. Usually, a pair of mesa grooves are formed in a manner such that the actuating region of a transistor is located between them and therefore "the inner groove wall" means the inner groove wall as seen from the actuating region of a transistor. That is, it is preferable that the groove wall of the second groove near the actuating region of a transistor inclines toward the direction of the actuating region of a transistor so as to enter the lower region of the actuating region of a transistor. As shown in FIG. 14, when a mesa groove 7 is formed substantially parallel with the thickness direction of the semiconductor device, a groove wall 7a near the actuating region of a transistor in the mesa groove inclines so as to come apart from the actuating region. In this case, an electric field concentration occurs in the vicinity of the groove wall on the side of the actuating region of a transistor in the mesa groove and therefore sufficient voltage-resistance cannot be ensured in some cases. However, by inclining the second groove as mentioned above, the spread of a depletion layer at the boundary region between the one-conductive area and the semiconductor substrate on the side of the actuating region of a transistor can be brought near to the vertical direction with respect to the groove's wall surface, thus obtaining an excellent spread of the depletion layer. As a result, the electric field concentration in the vicinity of the groove wall on the side of the actuating region of a transistor is relieved and therefore the voltage resistance increases.

In the structure mentioned above, it is preferable that the electrical insulator is formed of a film comprising a glass particle element. After applying an application liquid comprising glass particles, an insulating protective layer having excellent insulating characteristics can be formed efficiently by calcinating.

In the structure mentioned above, it is preferable that the first groove makes contact with the one-conductive area, the second groove makes contact with the boundary region between the one-conductive area and the semiconductor substrate and the electrical insulator covers the boundary region. According to such a preferable aspect, the connecting region between the base area and the collector area can be covered with the electrical insulator of the second groove, thus ensuring the preferable voltage-resistive characteristics, according to the present invention.

In the structure mentioned above, it is preferable that the upper area of the electrical insulator is within the first groove area and a gap region that does not make contact with the electrical insulator is provided on the internal circumference surface of the upper region of the first groove. By providing such a gap region, the adhesion of the electrical insulator in the periphery of the first groove due to the protrusion of the first groove can be prevented. As a result, the formation of a projection, or the like, formed of the electrical insulator on the upper surface of the semiconductor device can be restrained.

A semiconductor device according to a second structure of the present invention comprises: a one-conductive area with a thickness $D3$ provided in the upper region of a reverse conductive type semiconductor substrate area with a thickness $d2$; a groove having a wider width $W0$ than the thickness $d2$ and a depth $D0$ deeper than the $D3$ and shallower than the thickness $d2$ provided around a predetermined area in the one-conductive area so as to make contact with the one-conductive area; an electrical insulating film surrounding the periphery of the upper region of the groove; a glass protective layer covering at least a portion of the upper surface of the electrical insulating film and the internal circumference surface of the groove; and an opening region formed on the one-conductive area.

In the structure mentioned above, it is preferable that the electrical insulating film is provided in the periphery of the upper region of the groove. That is, the electrical insulation of the upper surface of the semiconductor device can be ensured by forming the electrical insulating film on the one-conductive area adjacent to the groove.

Furthermore, in the structure mentioned above, it is preferable that the glass protective layer as an insulating protective layer is provided on the electrical insulating film in the periphery of the upper region of the groove and the glass protective layer has a higher region than the electrode on the opening region (a contact window) formed in the electrical insulating film. As described above, when patterning and calcinating an applied film after applying an application liquid for forming the glass protective layer, shifts occur during patterning and, in some cases, the glass protective layer having a desired thickness cannot be formed inside the groove. As in the preferable aspect mentioned above, by forming the glass protective layer on the electrical insulating film so as to have a predetermined height or more, the possibility of obtaining the glass protective layer having a desired thickness formed on the internal circumference wall of the groove is greatly increased, even if the shift occurs during patterning. That is, the semiconductor substrate according to the preferable aspect mentioned above has excellent voltage-resistive characteristics in the groove region.

In the structure mentioned above, it is preferable that the semiconductor substrate area is a high-resistive area and the same conductive type low-resistive area as the semiconductor substrate area is provided on the side of the lower region of the semiconductor substrate area. According to such a preferable aspect, a semiconductor device having the base area that is the one-conductive area having a thickness $D3$ provided in the upper region of the semiconductor substrate area and the collector area that is the low-resistive area provided on the side of the lower region of the semiconductor substrate area can be formed.

In the structure mentioned above, it is preferable that in the relationship of the depth $D0$ of the groove, the thickness $d2$ of the reverse conductive type semiconductor substrate area and the thickness $D3$ of the one-conductive area, $D0$ is closer to $D3$ than to $d2$ in size. That is, it is preferable to satisfy $|d2-D0|>|D0-D3|$. According to such a preferable structure, since the depth of the groove can be made relatively shallow, the decrease in the thickness of the semiconductor substrate at the region forming the groove can be restrained, thus preventing the decrease in mechanical strength of the semiconductor substrate. In addition, by forming the groove shallow, the inclination of the internal circumference wall of the groove is gentle and therefore it becomes easy to form a glass protective layer having a uniform thickness over the entire groove.

In the structure mentioned above, it is preferable that the width $W0$ of the groove is wider than the depth $D0$ of the groove, particularly the width $W0$ is wider than the depth $D0$ by twice or more. That is, by forming the groove so as to have a wider and shallower shape, the inclination of the internal circumference surface of the groove becomes gentle and therefore it becomes easy to form the glass protective layer having a uniform thickness over the entire groove.

In the structure mentioned above, it is preferable that the glass protective layer is formed on the internal circumference surface of the groove at the contact region between the one-conductive area having a thickness of $D3$ and the semiconductor substrate area. According to such a preferable aspect, excellent voltage-resistive characteristics can be ensured, since the connecting region between the semiconductor substrate area and the one-conductive area is covered with the electrical insulator.

In the preferable aspect mentioned above, it is preferable that the glass protective layer has a thickness of 10 $\mu$m or more at the contact region. Herewith, the thickness of the glass protective layer means a thickness of the glass protective layer in the vertical direction with respect to the internal circumference surface of the groove at the contact region. Since an electric field concentration occurs at the boundary region between the semiconductor substrate and the one-conductive area, the thickness of the glass protective layer especially at this region is important. When this thickness is less than 10 $\mu$m, the effect as an insulating protective layer is small during subsequent manufacturing processes, thus reducing the manufacturing yield. Also, it becomes difficult to ensure a high reliability.

In the structure mentioned above, it is preferable that the groove is formed obliquely. Here, the term "obliquely" means that the groove is formed obliquely in such a direction as the bottom region of the groove enters into the lower region of the actuating region of a transistor. Especially, it is preferable that the inner wall of the groove is formed obliquely in the inward direction. Herewith, the inner groove wall is a groove wall near the actuating region of a transistor. Usually, since a pair of mesa grooves are formed in a manner that the actuating region of a transistor is located between them, and therefore "the inner groove wall" means the inner groove wall seen from the actuating region of a transistor. That is, it is preferable that the groove wall of the groove near the actuating region of a transistor inclines toward the direction of the actuating region of a transistor so as to enter the lower region of the actuating region of a transistor. As shown in FIG. 14, when the mesa groove 7 is formed substantially parallel with the thickness direction of the semiconductor device, a groove wall 7$a$ near the actuating region of a transistor in the mesa groove inclines so as to come apart from the actuating region. In this case, an electric field concentration occurs in the vicinity of the groove wall on the side of the actuating region of a transistor in the mesa groove and therefore sufficient voltage-resistance cannot be ensured in some cases. However, by inclining the groove as mentioned above, the spread of a depletion layer at the boundary region between the one-conductive area and the semiconductor substrate on the side of the actuating region of a transistor can be brought near to the vertical direction with respect to the groove wall surface, thus obtaining excellent spread of the depletion layer. As a result, the electric field concentration in the vicinity of the groove wall on the side of the actuating region of a transistor is relieved and therefore the voltage resistance increases.

Next, a method for manufacturing a semiconductor device according to the present invention comprises the steps of providing: a one-conductive area in the upper region of a semiconductor substrate; a wide and shallow first groove (width: W1, depth: D1) around a predetermined area in the one-conductive area; a second groove (width: W2, depth: D2) having a narrower width than that of the first groove in the first groove area; and an electrical insulator at least in the second groove.

In the method mentioned above, it is preferable that the electrical insulator is provided so as to leave a gap region that does not make contact with the electrical insulator on the internal circumference surface of the upper region of the first groove. That is, by providing the electrical insulator so as to form the gap region in which there is no electrical insulator in the upper region of the first groove, the formation of a projection, or the like, formed of the electrical insulator covering the mesa groove on the upper surface of the semiconductor device can be restrained in the semiconductor device obtained as a final product. As a result, the collateral effects mentioned above of the semiconductor device according to the first structure of the present invention mentioned above are further manifested. That is, the contact window and the electrode pattern formed within the contact window, formed in the process of opening the contact window, can be made very small easily and the mechanical contact during mask alignment in the process of opening the contact window is diminished.

In the structure mentioned above, it is preferable that the processes of providing the electrical insulator in the second groove consists of a process of depositing the electrical insulator at least in the second groove and a process of removing the electrical insulator from the periphery of the first groove. Particularly, it is preferable that the process of depositing the electrical insulator includes at least a step for applying a liquid mixture comprising glass powder and a photosensitive substance and the process of removing the electrical insulator includes at least a step for removing the electrical insulator from the periphery of the first groove by exposure and development. According to such a preferable aspect, an electrical insulator made of glass (a glass protective layer) can be provided efficiently in the groove region.

In the method mentioned above, it is preferable that the process of providing a one-conductive area in the upper region of the semiconductor substrate includes at least a step of forming the electrical insulating film on the one-conductive area and a step of forming a contact window in the electrical insulating film after providing the electrical insulator in the second groove. By forming the electrical insulating film on the one-conductive area and the contact window in the electrical insulating film after providing the electrical insulator in the second groove, a semiconductor device having a base area of the one-conductive area and a base electrode in the contact window can be obtained. Even if forming the first and second grooves after forming the electrical insulating film and providing the electrical insulator in the grooves, a layer consisting of the electrical insulator can also be formed in the end region of the electrical insulating film by providing the electrical insulator through an application method. Furthermore, subsequently, even if a contact window is formed in the electrical insulating film, a problem in the process of opening a contact window occurs rarely, owing to the collateral effects of the semiconductor device mentioned above, according to the first structure of the present invention.

In the method mentioned above, it is preferable that any steps before the process of providing the first groove include a process of forming the one-conductive area having a reverse conductive area in the upper portion of the semiconductor substrate, the electrical insulating film on the one-conductive area in which the reverse conductive area is formed and the contact window that makes contact with the reverse conductive area in the electrical insulating film after providing the electrical insulator in the second groove. According to such a preferable aspect, a semiconductor device having an emitter area of the reverse conductive area and an emitter electrode formed in the contact window can be obtained.

In the method mentioned above, it is preferable that the method includes processes of providing: the second groove so as to be deeper than the depth D3 of the one-conductive area; the electrical insulator so that the upper surface of the electrical insulator is approximately as high as or lower than the highest region on the reverse conductive area formed within the one-conductive area; and the contact window that makes contact with the reverse conductive area. By forming the second groove deeper than the depth D3, the boundary region between the base area and the collector area can make contact with the mesa groove. In addition, by making the depth D1 of the first groove shallower than the depth D3, the boundary region between the base area and the collector area can make contact with the second groove in which the electrical insulator is filled up. Consequently, excellent voltage-resistive characteristics can be obtained stably. By forming the electrical insulator so that the upper surface of the electrical insulator is approximately as high as or lower than the highest region on the reverse conductive area formed within the one-conductive area, the formation of a projection, or the like, formed of the electrical insulator covering the mesa groove on the upper surface of the semiconductor device can be restrained. As a result, the collateral effects mentioned above of the semiconductor device according to the first structure of the present invention are further manifested. That is, the contact window in the process of opening a contact window and the electrode pattern can be made very small easily and the mechanical contact during mask alignment in the process of opening a contact window is diminished. Herewith, in the case where an electrical insulating film, or the like, is formed on the reverse conductive area, the highest region on the reverse conductive area means the upper surface of the electrical insulating film. Furthermore, in the case where an electrical insulating film, or the like, is formed on the reverse conductive area, a semiconductor device having an emitter area of the reverse conductive area and an emitter electrode formed in a contact window can be obtained by providing the contact window that makes contact with the reverse conductive area.

In the method mentioned above, it is preferable that the electrical insulator is provided so as to have a thickness of 10 $\mu$m or more. Herewith, the thickness of the electrical insulator means the thickness of the electrical insulator in the vertical direction with respect to the internal circumference surface of the mesa groove. In the case where the thickness is less than 10 μm, the effect as an insulating protective layer in subsequent manufacturing processes is little. Therefore, manufacturing yield decreases and it is difficult to ensure a high reliability. Particularly, it is preferable that the depth D2 of the second groove is deeper than the thickness D3 of the one-conductive area and the thickness of the electrical insulator at the boundary region between the semiconductor substrate and the one-conductive area is 10 μm or more. Since an electric field concentration occurs at the boundary region between the semiconductor substrate and the one-conductive region, the thickness of the electrical insulator especially at this region is important.

In the method mentioned above, it is preferable that the second groove is formed obliquely. Herewith, the term "obliquely" means that the groove is formed obliquely in such a direction as the bottom region of the second groove enters into the lower region of the actuating region of a transistor. Especially, it is preferable that the inner groove wall of the second groove is formed obliquely in the inward direction. Here, the inner groove wall is a groove wall near the actuating region of a transistor. By inclining the second groove as mentioned above, the electric field concentration in the vicinity of the groove wall on the side of the actuating region of a transistor is relieved and therefore the voltage resistance increases.

In the method mentioned above, it is preferable that the processes for removing the electrical insulator from the periphery of the first groove include a process of removing at least a part of the electrical insulator deposited on the internal circumference surface of the first groove. For example, the preferable aspect mentioned above in which the deposition of the electrical insulator is conducted by applying a liquid mixture comprising glass powder and a photosensitive substance and the electrical insulator is removed from the periphery of the first groove by patterning the applied film by exposure and development is explained as an example as follows. That is, the expression "removing at least a part of the electrical insulator deposited on the internal circumference surface of the first groove" means that a part of the electrical insulator in the region making contact with the internal circumference wall of the first groove is removed from the electrical insulator deposited within the first groove, thus creating a predetermined clearance between the internal circumference wall of the first groove and the peripheral surface of the electrical insulator. By providing such a clearance, it becomes possible to apply the glass protective layer at the right place of the inner region of the first groove without swelling the upper surface of the glass protective layer formed after the calcination so as to be higher than the upper surface of the periphery of the first groove. By forming this clearance, the glass protective layer is not pulled up to the upper region of the first groove due to the adhesiveness at the time of the calcination and therefore the gap region mentioned above in which the glass protective layer does not adhere to the internal circumference surface of the upper region of the first groove can be formed. The measure of the clearance may be determined suitably considering the movement of the glass protective layer caused by the calcination.

EXAMPLES

The present invention will be explained further concretely using the following examples.

Example 1

Figure 2:
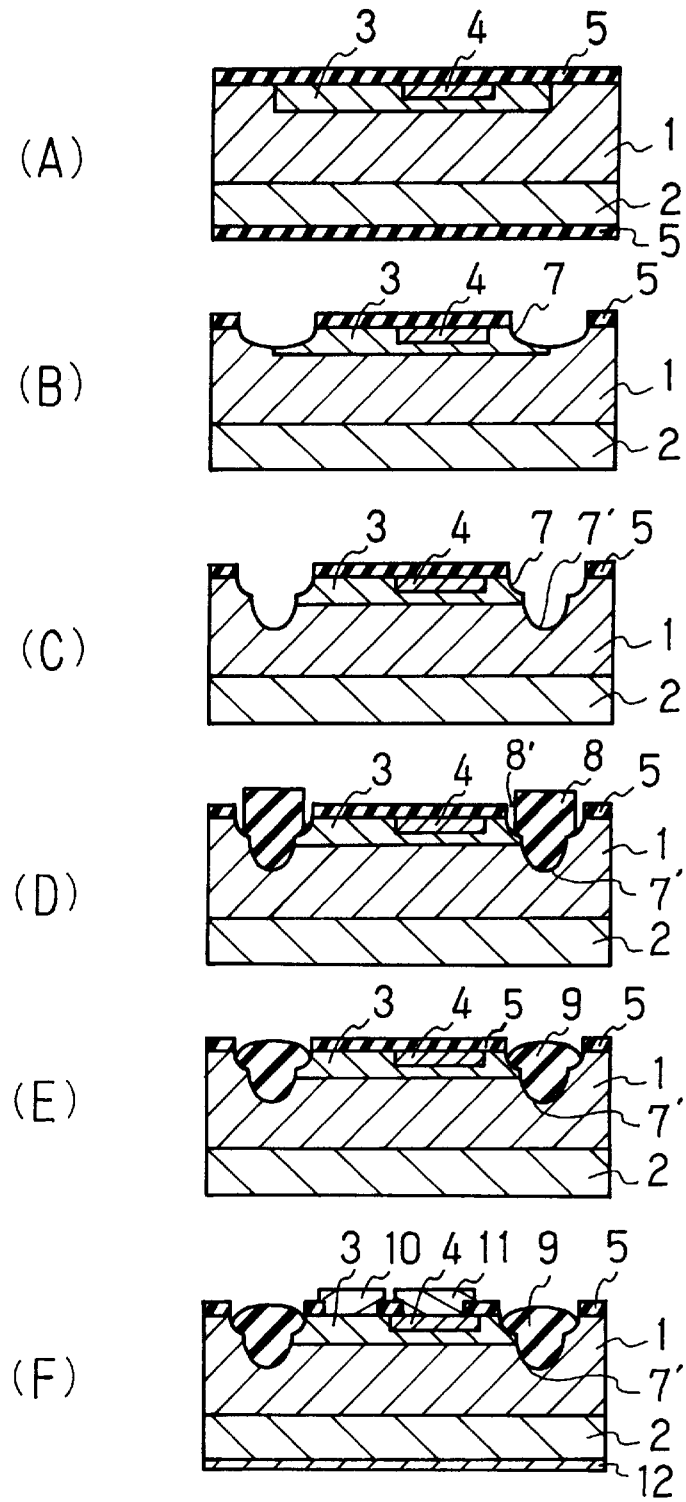
FIG. 2 shows a cross-sectional view of the transistor in FIG. 1 in each process for the purpose of explaining the manufacturing processes of the transistor.

FIG. 1 shows a cross-sectional view illustrating a schematic structure of an example of a semiconductor device (a mesa transistor) according to a first structure of the present invention. FIG. 2 shows cross-sectional views of the semiconductor device shown in FIG. 1 illustrating each process in a schematic manufacturing method.

Example 1 of the present invention will be explained using FIGS. 1–2 as follows.

A collector area 2 having a surface density of $2 \times 10^{20}$ cm$^{-3}$ and a diffusion depth of 130 μm was formed by diffusing phosphorus from one side of a N-type silicon substrate 1 having a specific resistance of 50 Ωcm and a thickness of 300 μm. The thickness (d2 in FIG. 1) of the N-type silicon substrate area (semiconductor substrate area) 1 was 170 μm. Then, a base area (a one-conductive area) 3 having a surface density of $1 \times 10^{19}$ cm$^{-3}$ and a diffusion depth (D3 in FIG. 1) of 30 μm was formed by diffusing boron from the opposite side of the collector area. Next, an emitter area (a reverse conductive area) 4 having a surface density of $1 \times 10^{20}$ cm$^{-3}$ and a diffusion depth of 15 μm was formed by diffusing phosphorus selectively. A numeral 5 indicates a silicon dioxide film (an electrical insulating film) (FIG. 2A).

After that, the electrical insulating film 5 in an area for forming a mesa groove was removed. Then, a first groove 7 having a depth (D1 in FIG. 1) of 20 μm and a width (W1 in FIG. 1) of 290 μm was formed by treating with a liquid mixture of hydrofluoric acid and nitric acid (1:4 in volume ratio) for 2 minutes (FIG. 2B).

A protective layer was then formed for etching silicon selectively, and a second groove 7' having a depth (D2 in FIG. 1) of 140 μm and a width (W2 in FIG. 1) of 200 μm was formed within the area of the first groove 7 by using the liquid mixture of hydrofluoric acid and nitric acid (1:4) (FIG. 2C).

Then, a liquid mixture 8 of glass powder (64 wt %; a mean particle diameter of 7 μm) and a photosensitive substance (36 wt %; negative resist) was applied to a silicon substrate by a spin coating method (a rotational centrifugal application method) so as to have a thickness of 30 μm. After that, the applied film was patterned by exposure and development and the applied film in the region where electrodes were formed was removed, thus leaving the applied film 8 only in an area of the first groove (a mesa groove region) 7. In this case, a part of the applied film formed on the internal circumference surface of the first groove 7 also was removed, so that a clearance 8' was formed between the internal circumference surface of the first groove and the peripheral surface of the applied film 8 after being removed (FIG. 2D).

Then, a glass powder film was left in the mesa groove region by burning the photosensitive substance in an oxidizing atmosphere at 500° C. for 30 minutes and then an electrical insulator 9 was formed by a heat treatment used for glass baking at 870° C. for 10 minutes (FIG. 2E).

After that, contact windows for forming electrodes were formed in the predetermined positions of the electrical insulating film 5 and a base electrode 10, an emitter electrode 11 and a collector electrode 12 were formed, thus obtaining a mesa semiconductor element with a high-voltage resistance (FIG. 2F).

Thus, the mesa transistor shown in FIG. 1 was obtained.

In the electrical insulator 9 of the transistor element obtained, its upper surface is lower than the upper surface of the electrical insulating film 5 and is placed on the internal circumference surface of the first groove 7. The upper surface of the electrical insulator 9 was not protruded from the first groove onto the electrical insulating film 5. That is, a gap region in which the electrical insulator 9 does not make contact with the upper region of the internal circumference surface of the first groove 7 was formed. The upper region of the electrical insulator 9 is swollen in the center portion like a dome shape as shown in FIG. 1. In the region where the upper portion of the electrical insulator 9 makes contact with the internal circumference surface of the first groove 7, a recessed region (a groove) 9' formed by the upper surface of the electrical insulator 9 and the internal circumference surface of the first groove 7 was formed.

In the example mentioned above, the base area (the one-conductive area) 3 was formed in the silicon substrate 1 selectively (FIG. 2 (A)), but the base area (the one-conductive area) 3 can be formed on the entire surface. In this case, the first and second grooves should be provided so as to surround the area that is formed by forming the emitter area (the reverse conductive area) 4 and that forms a functional area (an actuating region of a transistor) of a semiconductor device.

Example 2

Figure 3:
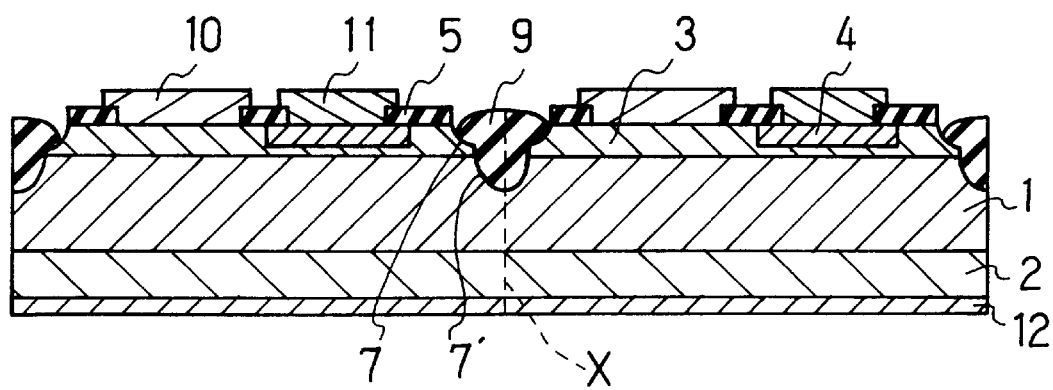
FIG. 3 shows a cross-sectional view of a mesa NPN transistor according to Example 2 of the present invention.
Figure 4:
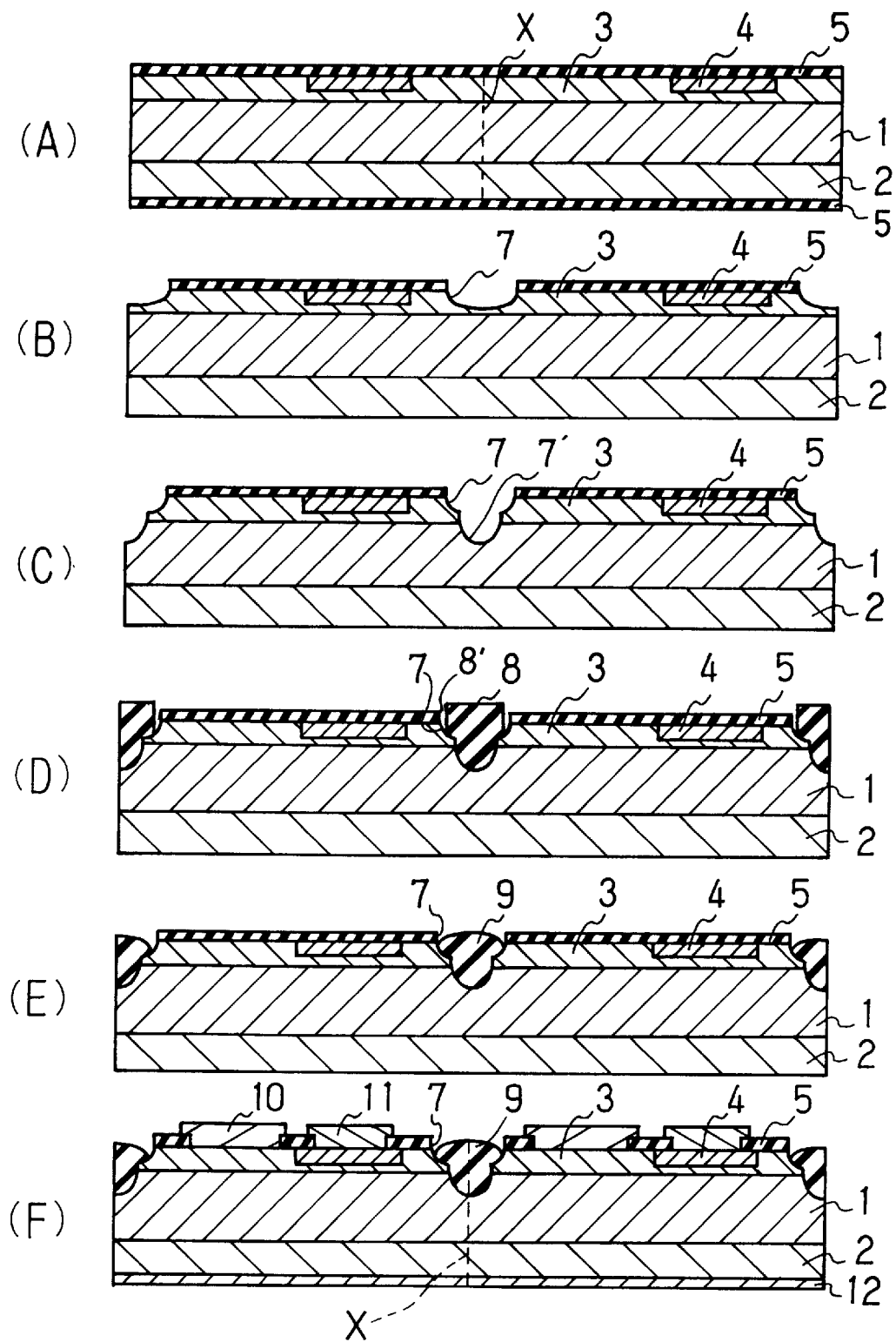
FIG. 4 shows a cross-sectional view of the transistor in FIG. 3 in each process for the purpose of explaining the manufacturing processes of the transistor.

FIG. 3 shows a cross-sectional view illustrating a schematic structure of another example of a semiconductor device (a mesa transistor) according to a first structure of the present invention. FIG. 4 shows cross-sectional views of the semiconductor device shown in FIG. 3 illustrating each process in a schematic manufacturing method.

Example 2 of the present invention will be explained using FIGS. 3–4 as follows.

A collector area 2 having a surface density of $2 \times 10^{20}$ cm$^{-3}$ and a diffusion depth of 130 µm was formed by diffusing phosphorus from one side of a N-type silicon substrate 1 having a specific resistance of 30 Ωcm and a thickness of 300 µm. Then, a base area (a one-conductive area) 3 having a surface density of $1 \times 10^{19}$ cm$^{-1}$ and a diffusion depth of 15 µm was formed by diffusing boron from the opposite side of the collector area. Next, an emitter area (a reverse conductive area) 4 having a surface density of $1 \times 10^{20}$ cm$^{-3}$ and a diffusion depth of 7 µm was formed by diffusing phosphorus selectively (FIG. 4A). A numeral 5 indicates a silicon dioxide film (an electrical insulating film) and a broken line X indicates a border at the time of chip partitioning.

Subsequently, the electrical insulating film 5 in an area for forming a mesa groove was removed. Then, a first groove (a mesa groove) 7 having a depth of 30 µm and a width of 480 µm was formed by treating with a liquid mixture of hydrofluoric acid and nitric acid (1:4 in volume ratio) for 3 minutes (FIG. 4B).

A protective layer was then formed for etching silicon selectively, and a second groove 7' having a depth of 150 µm and a width of 380 µm was formed within the area of the first groove 7 by using the liquid mixture of hydrofluoric acid and nitric acid (1:4) (FIG. 4C).

Then, a liquid mixture 8 of glass powder (64 wt %; a mean particle diameter of 7 µm) and a photosensitive substance (36 wt %; negative resist) was applied to a silicon substrate by a spin coating method so as to have a thickness of 30 µm. Subsequently, the applied film was patterned by exposure and development and the applied film in the region where electrodes were formed was removed, thus leaving the applied film only in the area of the first groove (a mesa groove region) 7. In this case, a region of the applied film formed on the internal circumference surface of the first groove 7 was also removed, so that a clearance 8' was formed between the internal circumference surface of the first groove and the peripheral surface of the applied film 8 after being removed (FIG. 4D).

A glass powder film was left in the mesa groove region by burning the photosensitive substance in an oxidizing atmosphere at 500° C. for 30 minutes and then an electrical insulator 9 was formed by a heat treatment used for glass baking at 870° C. for 10 minutes (FIG. 4E).

Subsequently, contact windows for forming electrodes were formed in the predetermined positions of the electrical insulating film 5 and a base electrode 10, an emitter electrode 11 and a collector electrode 12 were formed (FIG. 4F). Then, the substrate was divided along the broken line X, thus obtaining a mesa semiconductor element with a high-voltage resistance.

Thus, the mesa transistor shown in FIG. 3 was obtained (FIG. 3 shows the mesa transistor before being divided along the broken line X).

In the electrical insulator 9 of the transistor element obtained, its upper surface is lower than the upper surface of the electrical insulating film 5 and is placed on the internal circumference surface of the first groove 7. The upper surface of the electrical insulator 9 was not protruded from the first groove onto the electrical insulating film 5. That is, a gap region in which the electrical insulator 9 does not make contact with the upper region of the internal circumference surface of the first groove 7 was formed. The upper region of the electrical insulator 9 is swollen in the center portion like a dome shape as shown in FIG. 1. In the region where the upper region of the electrical insulator 9 makes contact with the internal circumference surface of the first groove 7, a recessed region (a groove) 9' formed by the upper surface of the electrical insulator 9 and the internal circumference surface of the first groove 7 was formed.

As is obvious from the above examples, in a semiconductor device that is finally obtained, the first grooves and the second grooves of the present invention include not only those having complete groove shapes as in Example 1 (FIG. 1) but also those divided along the broken line X as in Example 2 (FIG. 3). As in Example 2, a semiconductor device having a chip shape is formed by dividing the substrate in the groove region, thus obtaining a smaller semiconductor device and eliminating a waste of materials.

Figure 5:
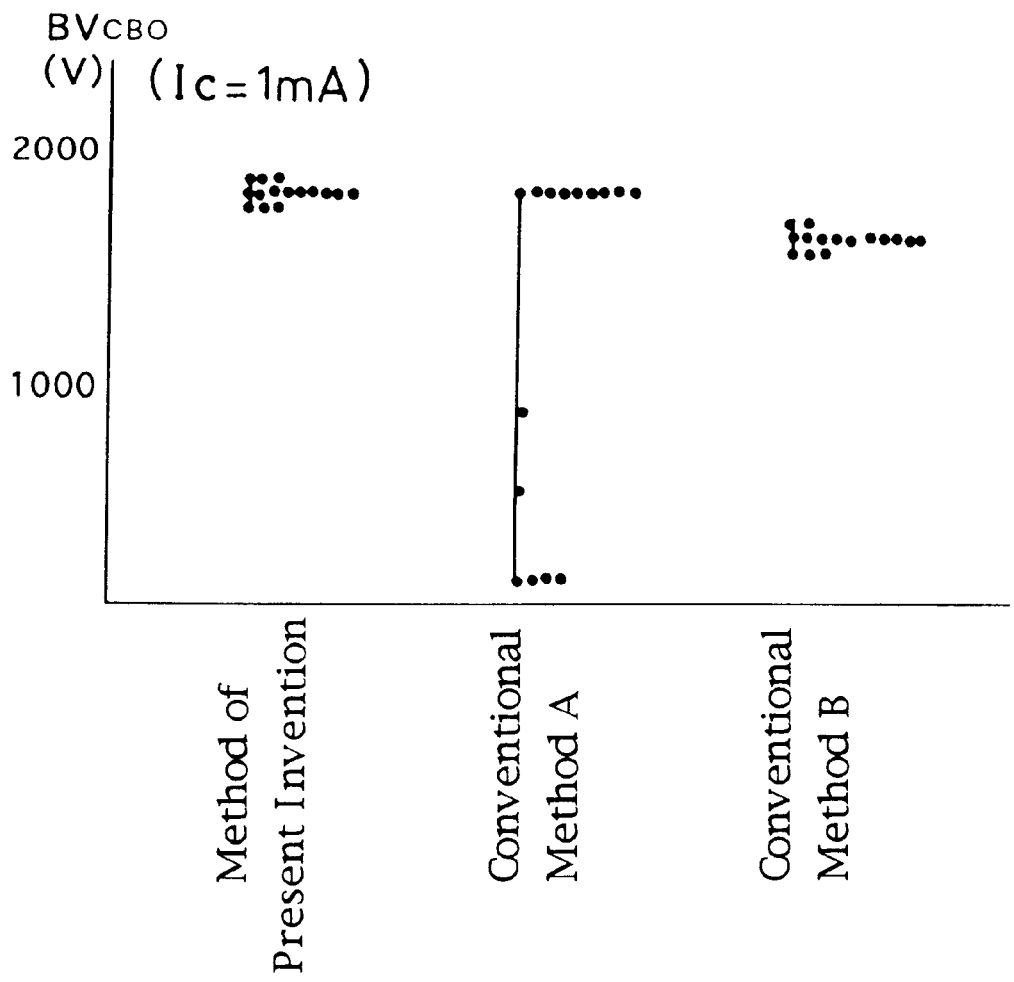
FIG. 5 shows a graph illustrating the comparison of collector reverse direction voltage-resistive electric characteristics in each mesa transistor according to the present invention and the conventional method.
Figure 6:
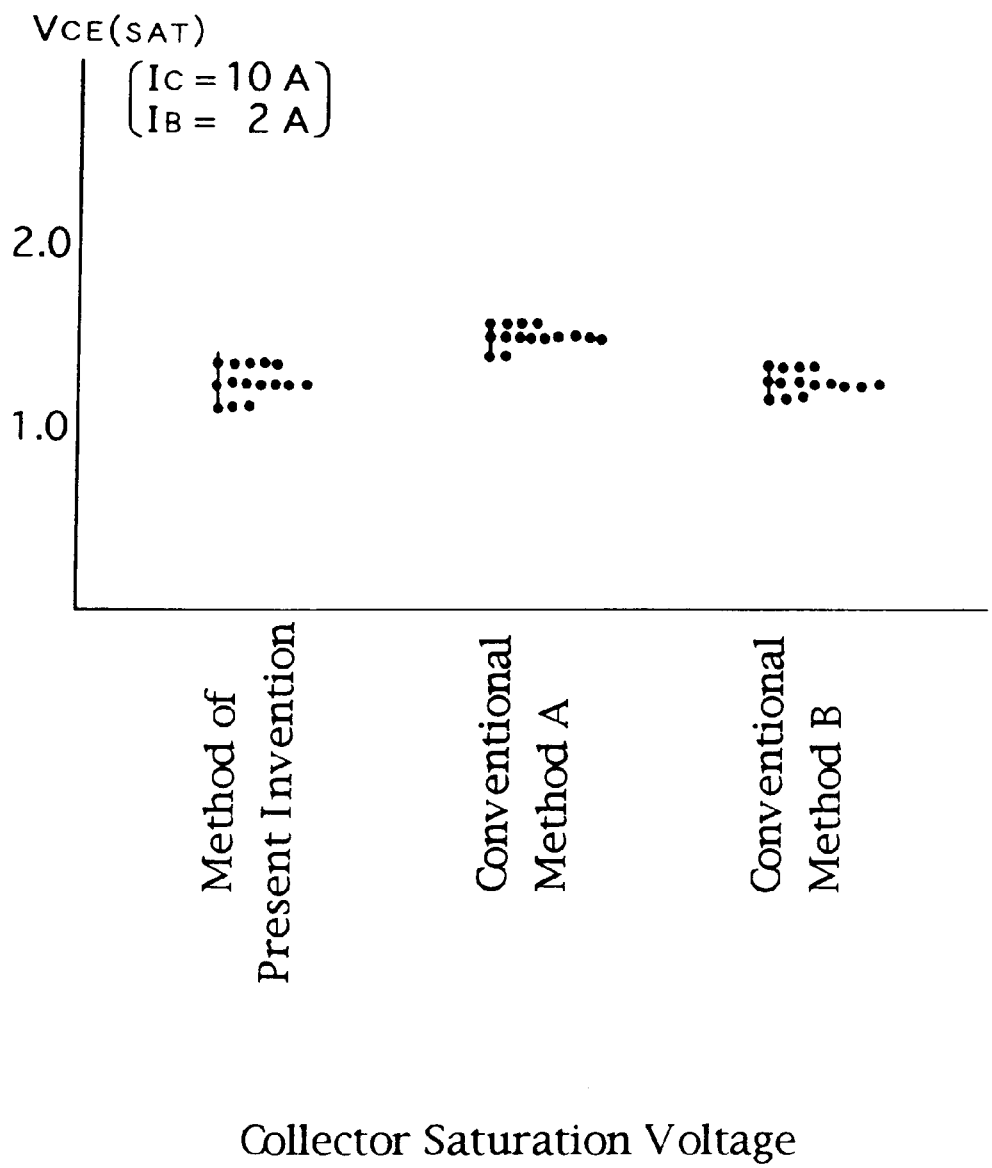
FIG. 6 shows a graph illustrating the comparison of collector saturated voltage characteristics in each mesa transistor according to the present invention and the conventional method.
Figure 15:
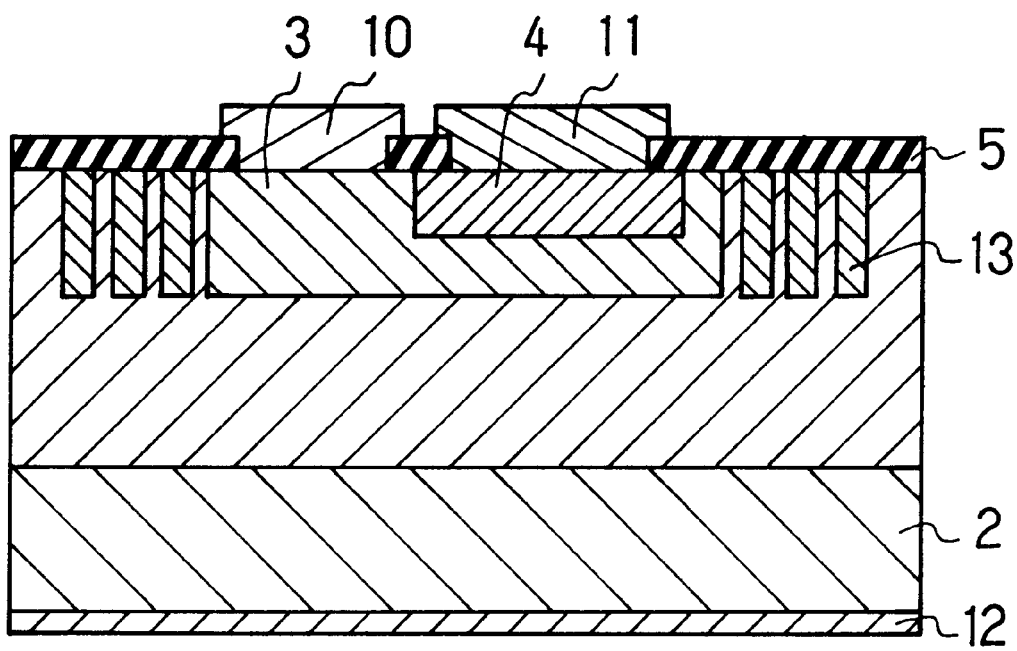
FIG. 15 shows a cross-sectional view illustrating a schematic structure of an example of a high planar transistor semiconductor element according to the conventional method.

Collector reverse direction voltage-resistive characteristics and collector saturation voltage in a mesa transistor according to the methods of the present invention (the first structure) and prior art are shown in FIG. 5 and FIG. 6 respectively. In FIG. 5, the vertical axis indicates a collector reverse direction resistive-voltage $BV_{CBO}$ when the collector current $I_C$ is 1 mA. In FIG. 6, the vertical axis shows a collector saturation voltage $VC_{CE(SAT)}$ when the collector current $I_C$ is 10 A and a base current $I_B$ is 2 A. In both figures, one black dot "•" indicates a measured value of one measurement sample. In the figures, "Method of Present Invention", "Conventional Method A" and "Conventional Method B" indicate the transistor element obtained in Example 1, the mesa transistor semiconductor element with a high-voltage resistance according to the conventional method shown in FIG. 14 and the high planar transistor semiconductor element according to the conventional method shown in FIG. 15 respectively.

As shown in Example 1 (FIGS. 1–2) and Example 2 (FIGS. 3–4), it is possible to form the electrical insulator having a thickness of 10 µm or more in the vicinity of the border between the P-type area of a one-conductive area and the N-type area of the semiconductor substrate in the present invention. As a result, it was confirmed that the effect as an insulating protective layer in subsequent manufacturing processes can be improved and the collector reverse direction voltage-resistive characteristics were greatly improved. Furthermore, since the upper surface of the electrical insulator 9 was formed so as to be lower than the upper surface of the insulating film 5 formed on the surface of the semiconductor substrate, the opening regions of contact windows for forming electrodes and the electrode regions can be made very small. Furthermore, it was confirmed that the collector saturation voltage was also greatly improved compared to that of the conventional product.

In addition, since the upper surface of the electrical insulator 9 is formed so as to be lower than the upper surface of the insulating film 5 formed on the surface of the semiconductor substrate, the mechanical contact between the convex region formed of the electrical insulator on the surface of the semiconductor substrate and a mask for opening a window selectively is greatly improved compared to that in the prior art. In addition, the depth of the mesa groove can be made shallower than that in the prior art. Thus, it was confirmed that cracking (manufacturing yield) during the manufacturing processes also decreased greatly as shown in Table 1. In Table 1, "Conventional Method" means a mesa transistor semiconductor element with a high-voltage resistance according to the conventional method shown in FIG. 14.

TABLE 1

Processing Yield (Cracking in a semiconductor substrate during manufacturing processes; unit: a substrate)

| | Handling Number | Non-Defective Article | Before forming mesa groove | During forming mesa groove | After forming mesa groove |
|---|---|---|---|---|---|
| Example 1 | 100 | 99 | 1 | 0 | 0 |
| Example 2 | 100 | 99 | 0 | 1 | 0 |
| Conventional Method | 100 | 84 | 1 | 1 | 14 |

In the examples above, a mesa NPN transistor with a high-voltage resistance was explained, but the same effects can be obtained in MOS, IGBT, thyristor, diode, or the like.

Example 3

Figure 7:
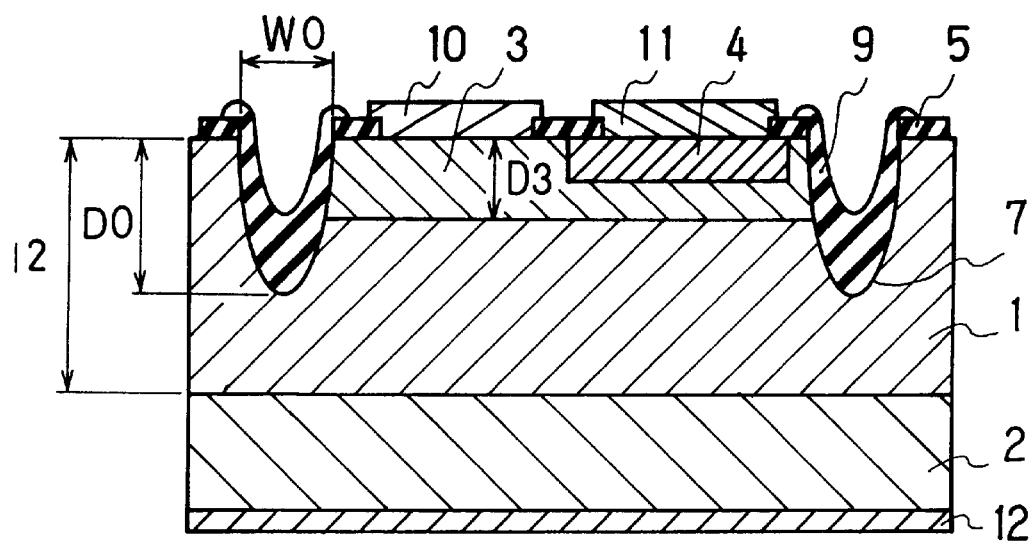
FIG. 7 shows a cross-sectional view of a mesa NPN transistor according to Example 3 of the present invention.
Figure 8:
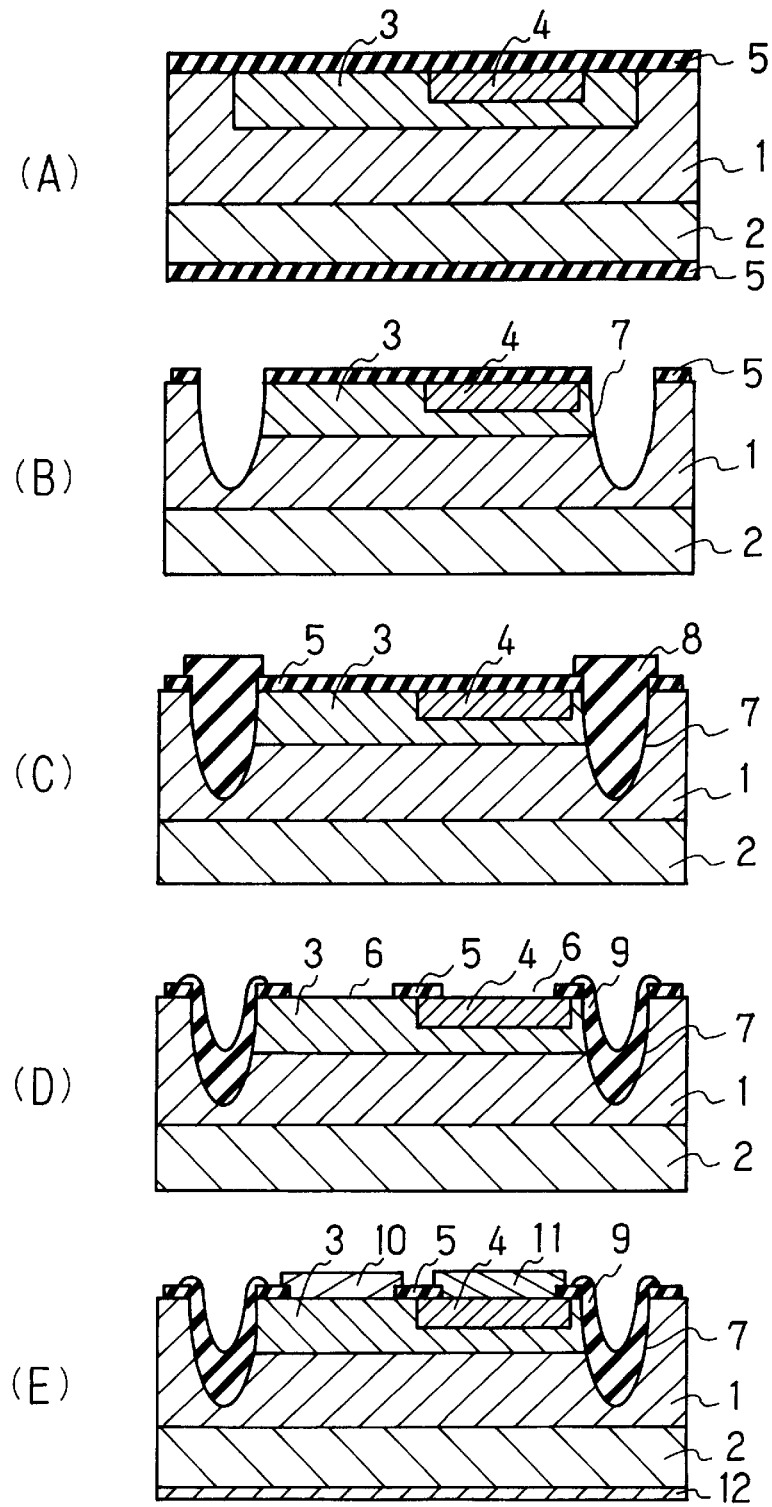
FIG. 8 shows a cross-sectional view of the transistor in FIG. 7 in each process for the purpose of explaining the manufacturing processes of the transistor.

FIG. 7 shows a cross-sectional view illustrating a schematic structure of an example of a semiconductor device (a mesa transistor) according to a second structure of the present invention. FIG. 8 shows cross-sectional views of the semiconductor device shown in FIG. 7 illustrating each process in a schematic manufacturing method.

Example 3 of the present invention will be explained using FIGS. 7–8 as follows.

A collector area (a low resistive area) 2 having a surface density of $2 \times 10^{20}$ cm$^{-3}$ and a diffusion depth of 130 $\mu$m was formed by diffusing phosphorus from one side of a N-type silicon substrate 1 having a specific resistance of 50 $\Omega$cm and a thickness of 300 $\mu$m. Then, a base area (a one-conductive area) 3 having a surface density of $1 \times 10^{19}$ cm$^{-3}$ and a diffusion depth of 30 $\mu$m was formed by diffusing boron from the opposite side of the collector area. Next, an emitter diffusion area (a reverse conductive area) 4 having a surface density of $1 \times 10^{20}$ cm$^{-3}$ and a diffusion depth of 15 $\mu$m was formed by diffusing phosphorus selectively. A numeral 5 indicates a silicon dioxide film (an electrical insulating film) (FIG. 8A).

Subsequently, the silicon dioxide film 5 in an area for forming a mesa groove was removed. Then, a mesa groove 7 having a depth (D0 in FIG. 7) of 70 $\mu$m and a width (W0 in FIG. 7) of 260 $\mu$m was formed by treating with a liquid mixture of hydrofluoric acid and nitric acid (1:4 in volume ratio) for 10 minutes (FIG. 8B).

Then, a liquid mixture 8 of glass powder (64 wt %; a mean particle diameter of 7 $\mu$m) and a photosensitive substance (36 wt %; negative resist) was applied to a silicon substrate by a spin coating method (a rotational centrifugal application method) so as to have a thickness of 30 $\mu$m. After that, the applied film was patterned by exposure and development and the applied film in the regions for forming electrodes was removed, thus leaving the applied film 8 only in an area of the mesa groove 7 (FIG. 8C).

Then, a glass powder film was left in the mesa groove region 7 by burning the photosensitive substance in an oxidizing atmosphere at 500° C. for 30 minutes and then a glass protective film (a passivation film) 9 was formed by a heat treatment method used for glass baking at 870° C. for 10 minutes. A numeral 6 indicates an opening region (a contact window) for forming an electrode (FIG. 8D).

Finally, a base electrode 10, an emitter electrode 11 and a collector electrode 12 were formed on the silicon substrate, thus obtaining a mesa semiconductor element with a high-voltage resistance (FIG. 8E).

Thus, the mesa transistor shown in FIG. 7 was obtained.

In the mesa transistor, the thickness (d2) of the N-type silicon substrate area 1 was 170 $\mu$m, the thickness (D3) of the bases area 3 was 30 $\mu$m, the width (W0) of the mesa groove 7 was 260 $\mu$m and the depth (D0) of the mesa groove 7 was 70 $\mu$m.

The glass protective layer 9 covering the internal circumference surface of the mesa groove 7 adhered also to the region in the vicinity of the periphery of the groove in the upper surface of the electrical insulating film 5 around the upper portion of the mesa groove 7. The thickness of the glass protective layer at the boundary region between the base area 3 and the N-type silicon substrate area 1 was about 30 $\mu$m.

In the example mentioned above, the base area (the one-conductive area) 3 was formed in the silicon substrate 1 selectively (FIG. 8 (A)), but the base area (the one-conductive area) 3 can be formed on the entire surface. In this case, the mesa groove 7 should be provided so as to surround the area that is formed by forming the emitter area (the reverse conductive area) 4 and that forms a functional area (an actuating region of a transistor) of a semiconductor device.

Example 4

Figure 9:
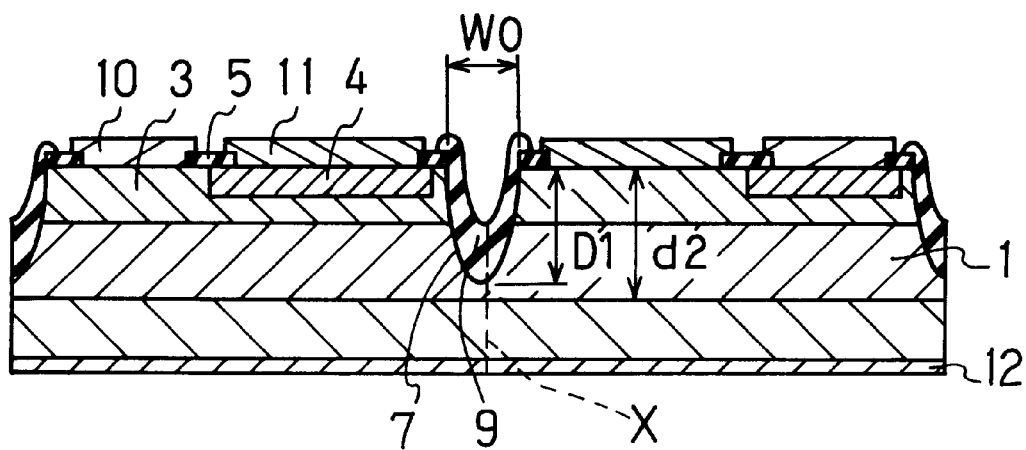
FIG. 9 shows a cross-sectional view of a mesa NPN transistor according to Example 4 of the present invention.
Figure 10:
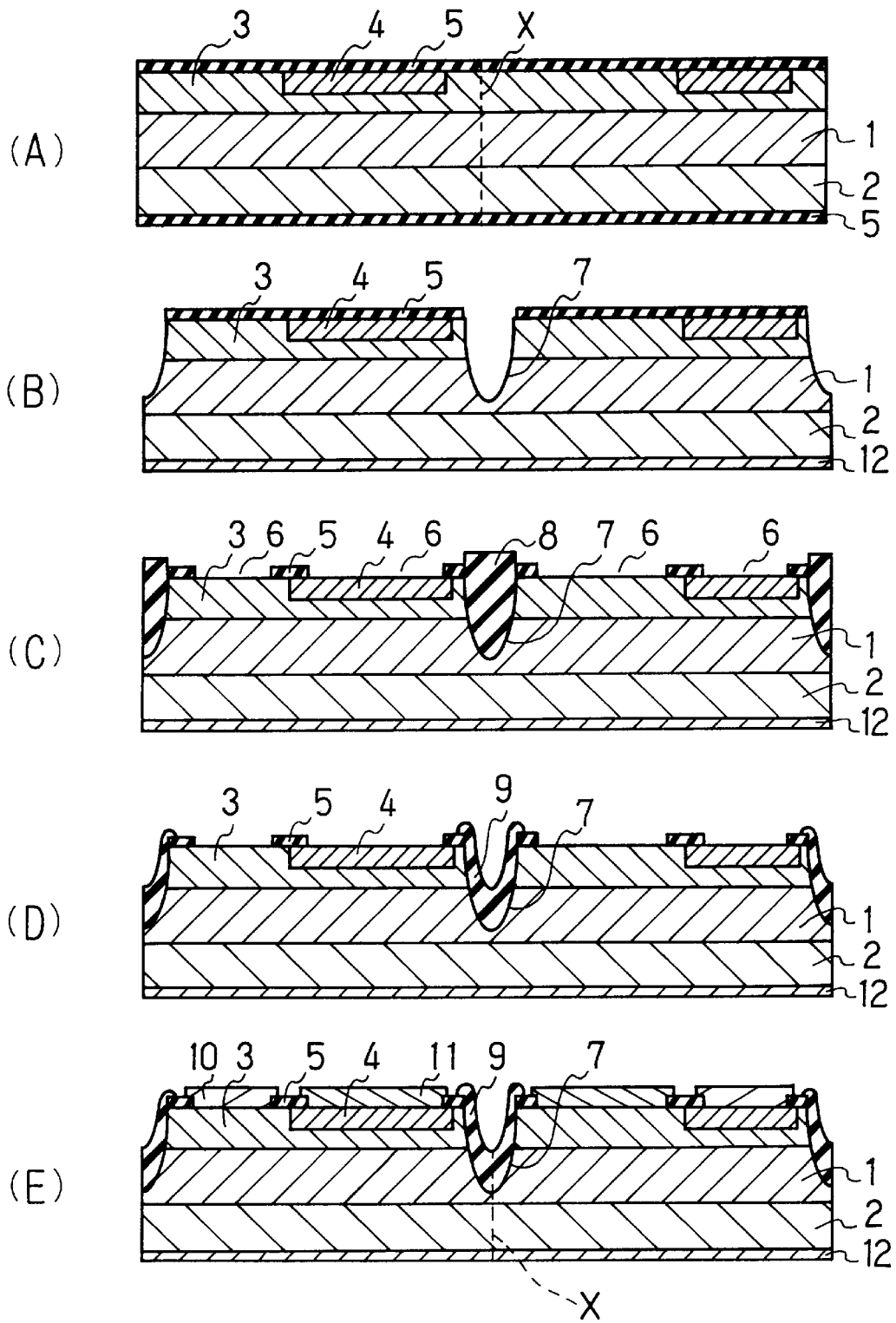
FIG. 10 shows a cross-sectional view of the transistor in FIG. 9 in each process for the purpose of explaining the manufacturing processes of the transistor.

FIG. 9 shows a cross-sectional view illustrating a schematic structure of another example of a semiconductor device (a mesa transistor) according to a second structure of the present invention. FIG. 10 shows cross-sectional views of the semiconductor device shown in FIG. 9 illustrating each process in a schematic manufacturing method.

Example 4 of the present invention will be explained using FIGS. 9–10 as follows.

A collector area 2 (a low resistive area) having a surface density of $2 \times 10^{20}$ cm$^{-3}$ and a diffusion depth of 130 $\mu$m was formed by diffusing phosphorus from one side of a N-type silicon substrate 1 having a specific resistance of 30 $\Omega$cm and a thickness of 300 $\mu$m. Then, a base area (a one-conductive area) 3 having a surface density of $1 \times 10^{19}$ cm$^{-3}$ and a diffusion depth of 15 $\mu$m was formed by diffusing boron from the opposite side of the collector area. Next, an emitter area (a reverse conductive area) 4 having a surface density of $1 \times 10^{20}$ cm$^{-3}$ and a diffusion depth of 7 μm was formed by diffusing phosphorus selectively. A numeral 5 indicates a silicon dioxide film (an electrical insulating film) and a broken line X indicates a border at the time of chip partitioning (FIG. 10A).

Subsequently, the silicon dioxide film 5 in an area for forming a mesa groove was removed. Then, a mesa groove 7 having a mesa depth (D0 in FIG. 9) of 30 μm and a width (W0 in FIG. 9) of 180 μm was formed by treating with a liquid mixture of hydrofluoric acid and nitric acid (1:4 in volume ratio) for 5 minutes. A numeral 12 indicates a collector electrode (FIG. 10B).

Then, a liquid mixture 8 of glass powder (64 wt %; a mean particle diameter of 7 μm) and a photosensitive substance (36 wt %; negative resist) was applied to a silicon substrate by a spin coating method so as to have a thickness of 30 μm. After that, the applied film was patterned by exposure and development and the applied film in the region for forming electrodes was removed, thus leaving the applied film 8 only in the area of the mesa groove region 7. A numeral 6 indicates an opening region (a contact window) for forming an electrode (FIG. 10C).

Subsequently, a glass powder film was left in the mesa groove region 7 by burning the photosensitive substance in an oxidizing atmosphere at 500° C. for 30 minutes and then a glass protecting film (a passivation film) 9 was formed by a heat treatment used for glass baking at 870° C. for 10 minutes (FIG. 10D).

Finally, a base electrode 10 and an emitter electrode 11 were formed on the silicon substrate (FIG. 10E) and the substrate was divided along the broken line X, thus obtaining a mesa semiconductor element with a high-voltage resistance.

Thus, the mesa transistor shown in FIG. 9 was obtained (FIG. 9 shows the mesa transistor before being divided along the broken line X).

In the mesa transistor, the thickness (d2) of the N-type silicon substrate area 1 was 170 μm, the thickness (D3) of the bases area 3 was 15 μm, the width (W0) of the mesa groove 7 was 180 μm and the depth (D0) of the mesa groove 7 was 30 μm.

As is obvious from the above examples, in a semiconductor device that is finally obtained, the mesa grooves of the present invention include not only those having complete groove shapes as in Example 3 (FIG. 7) but also those divided along the broken line X as in Example 4 (FIG. 9). As in Example 4, a semiconductor device having a chip shape is formed by dividing the substrate in the mesa groove region, thus obtaining a smaller semiconductor device and eliminating a waste of materials.

The glass protective layer 9 covering the internal circumference surface of the mesa groove 7 was adhered also to the region in the vicinity of the periphery of the groove in the upper surface of the electrical insulating film 5 around the upper region of the mesa groove 7. The thickness of the glass protective layer at the boundary region between the base area 3 and the N-type silicon substrate area 1 was about 30 μm.

Figure 11:
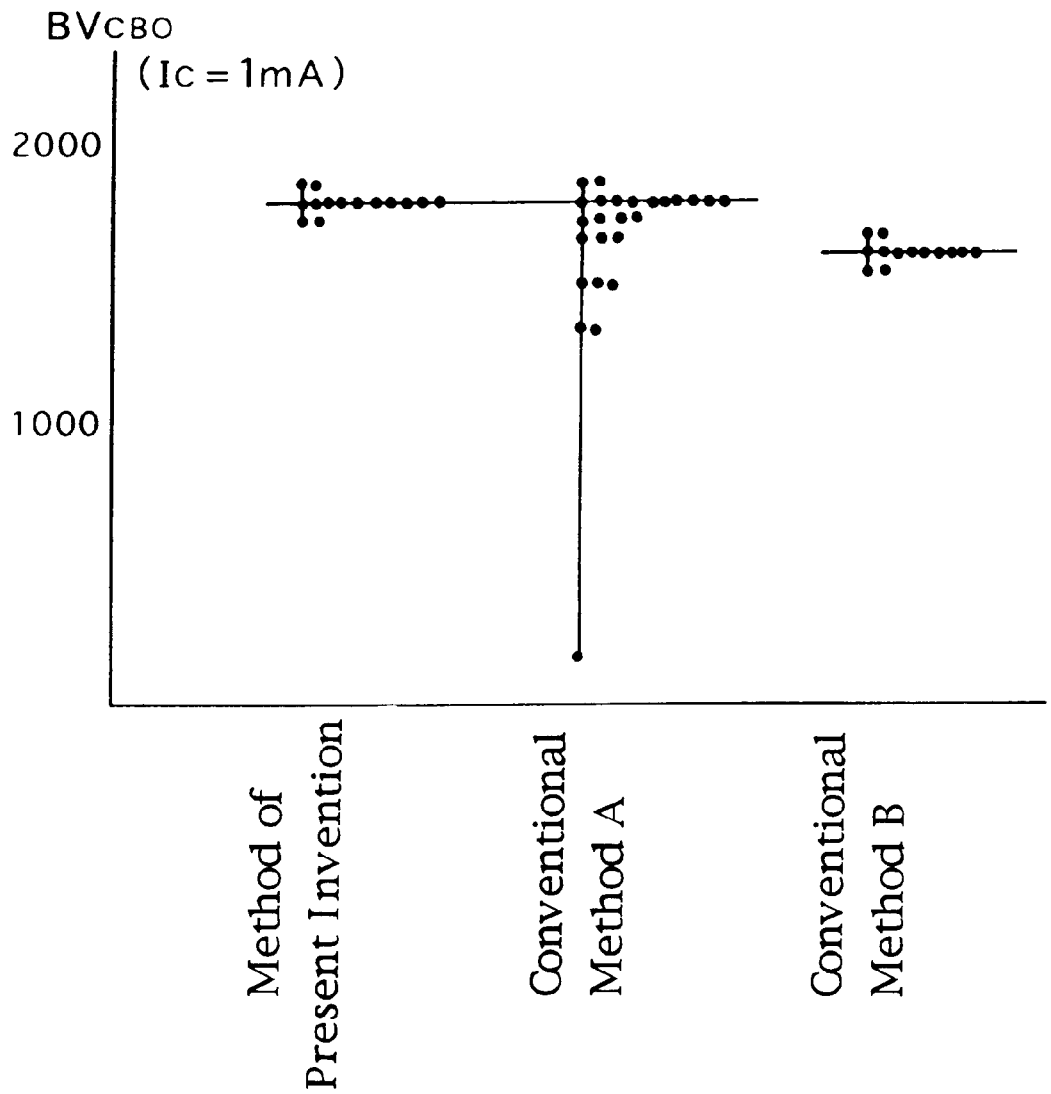
FIG. 11 shows a graph illustrating the comparison of collector reverse direction voltage-resistive electric characteristics in each mesa transistor according to the present invention and the conventional method.
Figure 12:
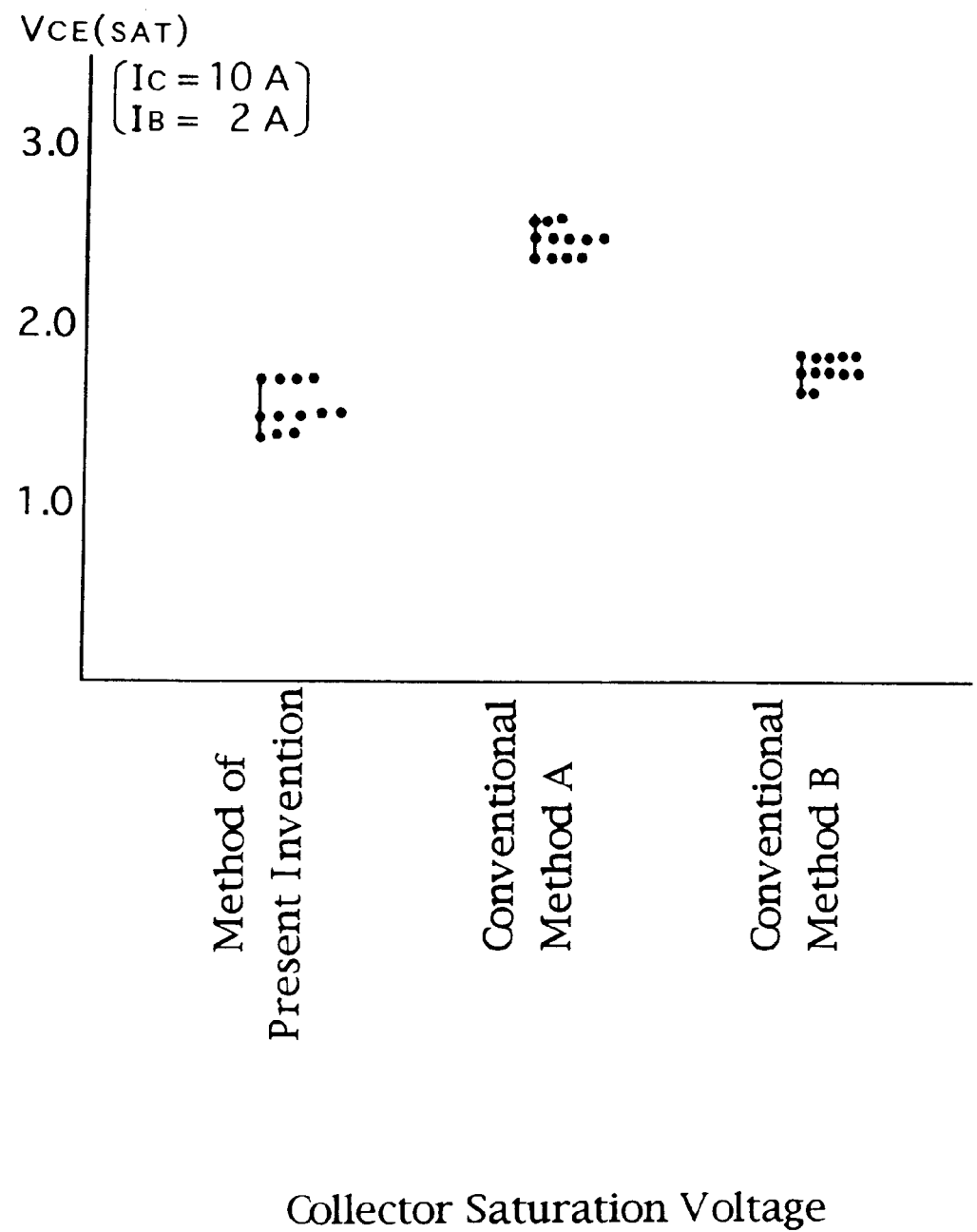
FIG. 12 shows a graph illustrating the comparison of collector saturated voltage characteristics in each mesa transistor according to the present invention and the conventional method.

Collector reverse direction voltage-resistive characteristics and collector saturation voltage in a mesa transistor according to the methods of the present invention (the second structure) and prior art are shown in FIG. 11 and FIG. 12, respectively. In FIG. 11, the vertical axis indicates a collector reverse direction resistive-voltage BV$_{CBO}$ when the collector current I$_C$ is 1 mA. In FIG. 12, the vertical axis shows a collector saturation voltage V$_{CE(SAT)}$ when the collector current I$_C$ is 10 A and a base current I$_B$ is 2 A. In both figures, one black dot "•" indicates a measured value of one measurement sample. In the figures, "Method of Present Invention", "Conventional Method A" and "Conventional Method B" indicate the transistor element obtained in Example 3, the mesa transistor semiconductor element with a high-voltage resistance according to the conventional method shown in FIG. 14 and the high planar transistor semiconductor element according to the conventional method shown in FIG. 15 respectively.

As shown in Example 3 (FIGS. 7–8) and Example 4 (FIGS. 9–10), by providing a wide (width: W0) and shallow (depth: D0) mesa groove, it is possible to form the glass protective layer having a thickness of 10 μm or more in the vicinity of the border between the P-type area of a one-conductive area and the N-type area of the semiconductor substrate in the present invention. As a result, it was confirmed that the effect as an insulating protective layer in subsequent manufacturing processes can be improved and the collector reverse direction voltage-resistive characteristics can be greatly improved.

Since the mesa groove was made shallow, the decrease of the thickness of the semiconductor substrate can be improved greatly and cracking (manufacturing yield) during subsequent manufacturing processes was improved greatly as shown in Table 2. In Table 2, "Conventional Method" means a mesa transistor semiconductor element with a high-voltage resistance according to the conventional method shown in FIG. 14.

TABLE 2

| | Processing Yield (Cracking in a semiconductor substrate during manufacturing processes; unit: a substrate) | | | |
|---|---|---|---|---|
| | Handling Number | Non-Defective Article | Before forming mesa groove | After forming mesa groove |
| Example 3 | 100 | 99 | 1 | 0 |
| Example 4 | 100 | 99 | 0 | 1 |
| Conventional Method | 100 | 89 | 1 | 10 |

In the examples above, a mesa NPN transistor with a high-voltage resistance was explained, but the same effects can be obtained in MOS, IGBT, thyristor, diode, or the like.

Example 5

Figure 13:
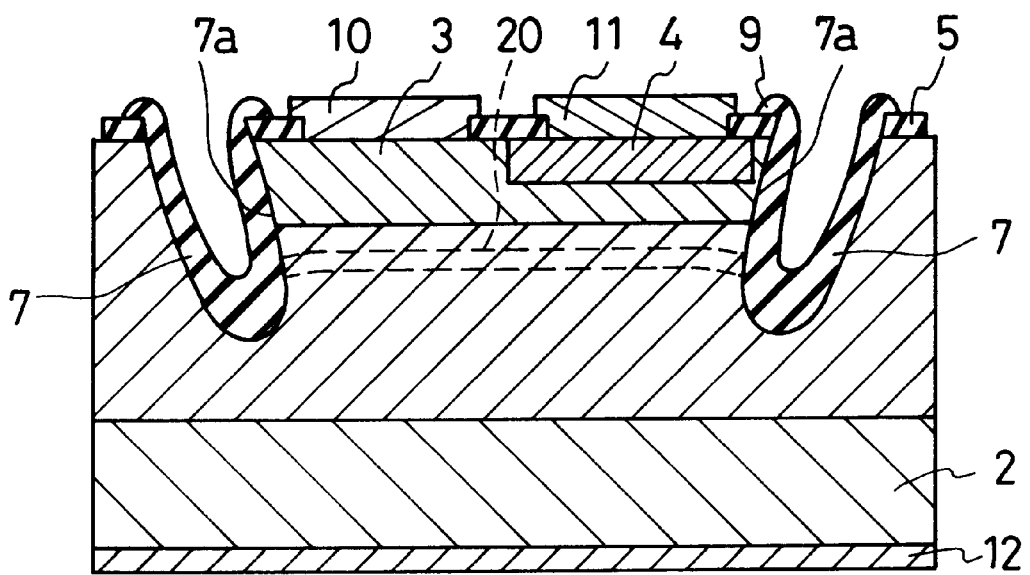
FIG. 13 shows a cross-sectional view of a mesa NPN transistor according to Example 5 of the present invention.

A mesa semiconductor element with a high-voltage resistance as shown in FIG. 13 was obtained by the same method as in Example 3 except forming the mesa groove 7 obliquely. In the mesa groove 7 formed, the groove wall (the inner wall of the groove) 7a, near the actuating region of a transistor inclines to the side of the actuating region (the inward direction) of the transistor so as to enter into the lower region of the actuating region of a transistor. In the oblique mesa groove, cutting of the groove was conducted by inclining the angle between a cutter and the semiconductor substrate. After that, a wet etching was conducted in order to eliminate damages caused by the cutter, thus forming the oblique mesa groove.

In the transistor element obtained, the collector reverse direction voltage-resistive characteristics and the collector saturation voltage were measured as in Example 3. As a result, in the transistor element of the present Example 5, it was found that the collector reverse direction voltage-resistive characteristics were improved by about 5% when making the collector saturation voltage the same compared to that of the transistor element of Example 3.

It is conceivable that the voltage-resistive characteristics of the transistor element of the present Example 5 were improved compared to that of Example 3, since the spread of the depletion layer 20 was brought near to the vertical direction with respect to the groove wall surface 7a in the vicinity of the boundary region between the semiconductor substrate and the one-conductive area by forming the mesa groove 7 obliquely, as shown in FIG. 13, thus relieving the electric field concentration in the vicinity of the groove wall of the side of the one-conductive area.

Example 5 was explained referring to an example in the case of forming the mesa groove in Example 3 obliquely. However, also in a semiconductor device shown in Example 1 in which the mesa groove comprises a first groove and a second groove, the same effects can be obtained by inclining the second groove making contact with the boundary region between the semiconductor and the one-conductive area as in the case mentioned above.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A semiconductor device, comprising:
   a one-conductive collector area with a predetermined density;
   a one-conductive semiconductor substrate area on the collector area, which has a first thickness in a predetermined region and a lower density than that of the collector area;
   a second conductive base area formed in the predetermined region on the semiconductor substrate area, which has a second thickness D3; and
   a one-conductive emitter area formed in a region of a surface layer of the base area;
   a wide and shallow first groove provided around the base area, wherein a depth D1 of the first groove from a surface of the base area is shallower than a thickness D3 of the base area;
   a second groove having a narrower width than that of the first groove provided in the first groove area, wherein a depth D2 of the second groove from the surface of the base area is shallower than a total thickness d2 of the semiconductor substrate area and the base area formed thereon; and
   an electrical insulator covering at least the second groove.

2. A semiconductor device, comprising:
   a one-conductive collector area with a predetermined density;
   a one-conductive semiconductor substrate area on the collector area, which has a first thickness in a predetermined region and a lower density than that of the collector area;
   a second conductive base area formed in the predetermined region on the semiconductor substrate area, which has a second thickness D3;
   a one-conductive emitter area formed in a region of a surface layer of the base area;
   a groove provided around the base area, wherein a depth D0 of the groove from a surface of the base area is shallower than a total thickness d2 of the semiconductor substrate area and the base area formed thereon; and
   an electrical insulator covering the groove.

3. The semiconductor device according to claim 2, wherein a width W0 of the groove at the surface of the base area is wider than the total thickness d2.

* * * * *